(12) United States Patent
Occhipinti et al.

(10) Patent No.: US 7,272,511 B2
(45) Date of Patent: Sep. 18, 2007

(54) MOLECULAR MEMORY OBTAINED USING DNA STRAND MOLECULAR SWITCHES AND CARBON NANOTUBES, AND METHOD FOR MANUFACTURING THE SAME

(75) Inventors: Luigi Occhipinti, Ragusa (IT); Francesco Buonocore, Angri (IT); Vincenzo Vinciguerra, Biancavilla (IT); Gianguido Rizzotto, Civate (IT); Giuseppe Panzera, San Pietro Ci Arenza (IT); Floriana San Biagio, Catania (IT); Francesco Italia, Catania (IT)

(73) Assignee: STMicroelectronics, S.r.l., Agrate Brianza (MI) (IT)

( * ) Notice: Subject to any disclaimer, the term of this patent is extended or adjusted under 35 U.S.C. 154(b) by 420 days.

(21) Appl. No.: 10/601,327

(22) Filed: Jun. 19, 2003

(65) Prior Publication Data
US 2004/0114445 A1    Jun. 17, 2004

(30) Foreign Application Priority Data
Jun. 20, 2002    (EP) .................................. 02425408

(51) Int. Cl.
*B81B 7/02* (2006.01)
*C12Q 1/68* (2006.01)
*G11B 3/70* (2006.01)
*G06F 19/00* (2006.01)

(52) U.S. Cl. ............................ 702/32; 435/6; 369/273; 977/855; 977/885

(58) Field of Classification Search ..................... None
See application file for complete search history.

(56) References Cited

U.S. PATENT DOCUMENTS

| | | | |
|---|---|---|---|
| 6,314,019 B1 | 11/2001 | Kuekes et al. | |
| 6,486,489 B2* | 11/2002 | Watanabe et al. | 257/9 |
| 6,958,216 B2* | 10/2005 | Kelley et al. | 435/6 |
| 7,122,461 B2* | 10/2006 | Dubin | 438/618 |

FOREIGN PATENT DOCUMENTS

| | | |
|---|---|---|
| WO | WO00/47600 | 8/2000 |
| WO | WO02/17362 | 2/2002 |

OTHER PUBLICATIONS

Bradsher, C.K.. Friedel-Crafts reaction. in AccessScienceEMcGraw-Hill (Apr. 10, 2000).*
European Search Report, EP02425408, Jan. 21, 2003.
Kasumov, A. Yu, et al., Proximity-Induced Superconductivity in DNA, American Association for the Advancement of Science, vol. 291, pp. 280-282 (2001).
Liu, Oinghua, et al., DNA Computing on Surfaces. Nature, Macmillan Journals LTD, vol. 403, No. 6766, pp. 175-179 (2000).

* cited by examiner

*Primary Examiner*—Marjorie A. Moran
(74) *Attorney, Agent, or Firm*—Graybeal Jackson Haley LLP

(57) ABSTRACT

Described herein are a molecular memory obtained using DNA strand molecular switches and carbon nanotubes, and a manufacturing method thereof. In particular, the nonvolatile memory is manufactured according to an architecture that envisages the use of carbon nanotubes as electrical connectors and DNA strands as physical means on which to write the information. In other words, the nonvolatile memory is made by means of a set of molecular DNA strand switches, the addressing of which is controlled by molecular wires made up of carbon nanotubes.

16 Claims, 7 Drawing Sheets

TOP NANOTUBE

MOLECULAR LAYER

BOTTOM NANOTUBE

Address Lines

Memory

Data Lines

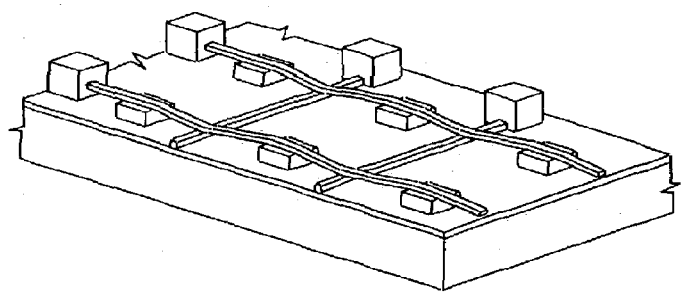
Fig.4a
(Background Art)
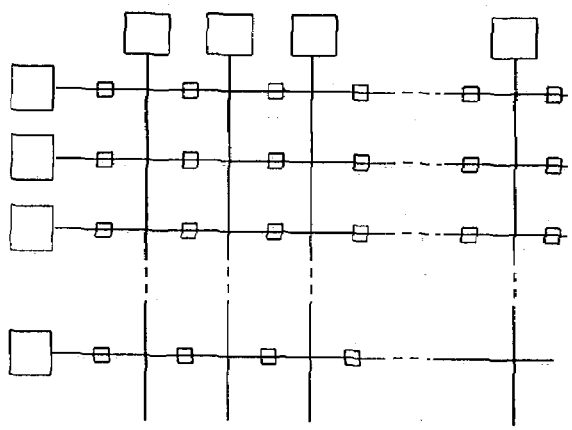
Fig.4b
(Background Art)
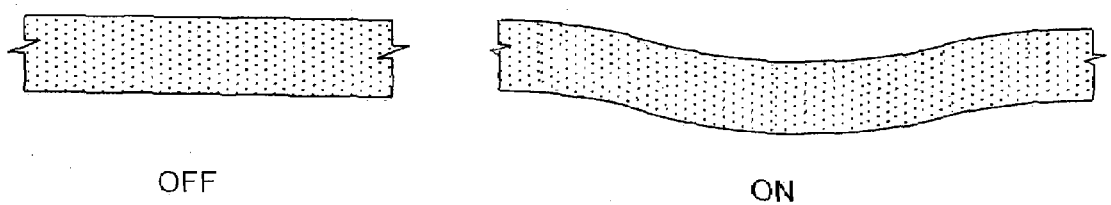
OFF                ON
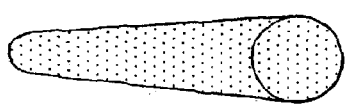
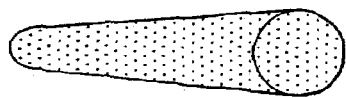
Fig.5a                Fig.5b
(Background Art)      (Background Art)

MOLECULAR MEMORY OBTAINED USING DNA STRAND MOLECULAR SWITCHES AND CARBON NANOTUBES, AND METHOD FOR MANUFACTURING THE SAME

PRIORITY CLAIM

This application claims priority from European patent application No. 02425408.8, filed Jun. 20, 2002, which is incorporated herein by reference.

TECHNICAL FIELD

The present invention relates generally to a molecular memory, and, more specifically, to a molecular memory obtained using DNA strand molecular switches and carbon nanotubes. The present invention further relates, generally, to a method for manufacturing said molecular memory.

BACKGROUND

In the last few years, the substantial success of CMOS technology has been determined basically by the possibility of constantly reducing the size of electronic devices. In fact, this technology follows the so-called Moore's law, according to which the number of transistors that can be made on an integrated circuit and hence the computing speed should double in a time range of between 18 and 24 months.

However, it is a common conviction that conventional silicon microelectronics will not be able to continue indefinitely to follow this law, in so far as sooner or later physical limits will certainly be reached, which will prevent current circuits from functioning reliably at nanometric dimensions, whereas, at the same time, an exponential increase in production costs will render any further increase in the levels of integration prohibitive. In fact, as the density of the electronic devices on a chip increases, phenomena such as the need to dissipate the heat generated by such densely populated circuits, and the transition from the classical behaviour to the quantistic behaviour of the charge carriers will considerably slow down progress.

In particular, thanks to the use of lithographic techniques, sizes of the order of 100 nm have currently been reached. Notwithstanding the rapid progress achieved in the current process of scale integration, present-day technology is unlikely to allow further scaling beyond this critical size. In fact, once this critical size has been reached, the small electric currents which carry the information transfer uncontrollably vary from one device to another. In particular, when the quantistic effects start to be important, transistors tend to lose the electrons that represent the information, so that it becomes difficult to keep them in their original state. It is foreseeable that, below the size referred to above of 100 nm, the said difficulties will become of major importance.

The need to solve the above problems has pushed research towards the study of new technologies based upon the use of organic materials which could replace silicon either completely or in part in the manufacture of electronic devices.

Molecular electronics affords the potential for overcoming the limits of on-silicon technology, in so far as it is possible to manufacture single-molecule devices which are organized in parallel by means of self-assembly techniques that are also economically advantageous.

In particular, whilst it is possible, with current technologies, to produce high-density flash-memory units with capacities in the region of 64-128 Mb, but with high costs, in the future, by resorting to memories of a molecular type, it will be possible to achieve memory capacities of various tens or hundreds of gigabits, in which each memory cell will be made up of one or more molecules, the structural configuration of which may be associated to different possible and modifiable states by means of interactions at an atomic level or at the level of individual electrons.

There has consequently arisen the need to explore the possibility of passing from the current techniques of assembly of a top-down type, whereby it is possible to arrive at the desired dimensions, by successive removal of a macroscopic amount of a material, to bottom-up technologies, whereby it is possible to manufacture, and subsequently assemble, nanoscopic components, starting from individual atoms or molecules, i.e., components in which the devices involved in management and retention of data are molecules arranged and interconnected so as to form a circuit.

The range of prototypes of molecular devices proposed is very wide, as emerges from the review article by C. Joachim, J. K. Gimzewski, A. Aviram, Nature 408, 541 (2000).

In the above prototypes, the problem of monitoring the molecule, so as to bring its behaviour back to the macroscopic world, has up to now been approached with the introduction of the scanning-tunnelling microscope (STM).

Nonetheless, up to now the different proposed solutions do not enable large-scale integration of molecular electronics for industrialization purposes.

Amongst the different prototypes of molecular memories which have been proposed and which use different types of molecules, two are worthy of particular attention: the non-volatile memory based upon the use of the bipyridine molecule manufactured at the University of Liverpool and described in Gittins et al., Nature 408, 67 (2000), and the molecular memory based upon the use of the rotaxane molecule, described in the U.S. Pat. No. 6,128,214, granted on October, 2000, in the name of Hewlett-Packard.

In particular, in a molecular memory, retention of the information bit is entrusted to a molecule which acts as a switch. In detail, the University of Liverpool has made a switch that is also based on the change of the chemical state of oxidation of a molecule. In practice, a monolayer has been made, containing molecules with a bipyridinium group, attached to an electrode and to a nanocluster, both made of gold, through thiol chains arranged at the two ends, as illustrated in FIG. 1. The tip of a scanning-tunnelling microscope detects the flow of current through the molecular switch. The electrons can be injected into the bipyridinium group by applying an appropriate potential difference between the substrate and an electrode arranged alongside the self-assembled monolayer, immersed in the surrounding electrolyte. When both of the nitrogen atoms on the benzene cycles are oxidized, no current flows. Instead, when an electron is added on one of the two nitrogen atoms, a big current flows. The size of this device is 10 nm.

Instead, in the U.S. Pat. No. 6,128,214, the switching function is carried out by the rotaxane molecule, a synthetic molecule which has two states, only one of which enables passage of current. Broadly speaking, the molecule, arranged between two conductive wires, functions as a bridge between the wires: when the molecule is present, the electrons can flow from one wire to the other, and the switch closes the circuit. If an electric field is applied, the rotaxane changes configuration, the bridge disappears and the switch opens the circuit. In particular, the molecule behaves as a switch that closes and conducts by resonant tunnelling when it is in the reduced state, whilst it behaves as a switch that opens and hence functions as a barrier for tunnelling conduction when it is in its oxidized state.

In greater detail, the storage device described in the U.S. Pat. No. 6,128,214 is illustrated schematically in FIGS. 2a and 2b and is made up of two parallel layers of nanometric conductors arranged perpendicular to one another, between which there is interposed a layer of rotaxane molecules. A bistable rotaxane molecule is arranged in a position corresponding to each intersection of the pairs of conductors and in effect defines a switch. An applied voltage modifies the electronic state of the molecules and, hence, the resistance between the top conductor and the bottom conductor. The switches are activated by electrochemical oxidation or reduction of the molecules. When a switch is electrochemically closed, the resistance between the connected conductors is low, and this state constitutes a logic "1". When the switch is open, the resistance is high, and this state represents a logic "0". In order to read the state of the switch, it is necessary to apply another voltage, the value of which is such as not to cause switching of the state of the junction. Consequently, the reading process is not destructive.

With the molecules described above, it is thus possible to make memory cells using connectors between the molecules as crossbar system, which enable writing and reading of the state of each individual memory element.

The limits of the above molecular memories are basically linked to the poor efficiency of the contacts, i.e., the difficulty of arranging the molecules in contact with the nanometric conductors, which are made of silicon or metal, to the instability of the molecules at high temperatures, and to the possibility of giving rise to multiple current paths.

In order to overcome the drawbacks of the molecular memories described above, in the article "Carbon Nanotube-Based Nonvolatile Random Access Memory for Molecular Computing", Science, Vol. 289 (5476), Jul. 7, 2000, 94-97, there is proposed the manufacture of nonvolatile memories based upon the use of molecular structures known as carbon nanotubes (CNTs).

It is known that carbon atoms have the property of organizing themselves to form different structures, giving rise to materials of different forms. In fact, a diamond is made up of carbon atoms organized in tetrahedrons, whilst graphite is made up of carbon atoms organized in planar structures. These two allotropic forms, albeit originating from the same type of atoms, exhibit structural properties (hardness, elasticity, friction) and functional properties (electrical conductivity, colour, etc.) that are highly different and frequently opposite to one another. The structural characteristics, such as hardness and refractoriness, of graphite and diamond render a top-down approach hard to implement on a device at nanometric scales. Instead, a bottom-up approach is rendered possible by the use of another allotropic form of carbon, namely fullerene.

Belonging to the family of the fullerenes is $C_{60}$, also known as buckyball, which presents a molecular structure having the shape of a polyhedral cage, consisting of pentagons and hexagons. The fullerene structures that develop as long cylinders, rather than as spheres, are called nanotubes. Their length (of several microns) may be thousands of times greater than their diameter (of the order of nanometers). In addition, using known techniques of molecular synthesis, there have been observed, in the laboratory, single-walled cylindrical structures (single walled nanotubes—SWNTs), having a diameter of 1-2 nm, and multiple-walled structures (multiple walled nanotubes—MWNTs), i.e., made up of coaxial cylinders with diameters of a few tens of nanometers.

Carbon nanotubes are organic molecules made up of a number of interconnected carbon atoms in a cylindrical structure, characterized by a small weight, and they present exceptional elastic properties, which render them extremely hard, but also capable of undergoing large deformations without breaking. Thanks to their exceptional property of conducting electrical charges, carbon nanotubes, since they can be configured both as conductors and as semiconductors, are suitable for forming components of a new class of nanometric electronic devices. In particular, they are expected to play a primary role in the development of molecular electronics, owing to the fact that, thanks to their lateral dimensions (of the order of nanometers) and to their electrically conductive properties, they behave as quantum conductive wires of nanometric dimensions (the so-called quantum nanowires).

Carbon nanotubes have different shapes, which can be described by a vector, referred to as chiral vector C, as illustrated in FIG. 3.

In particular, in geometrical terms, a carbon nanotube (CNT) can be obtained from a sheet of graphite, by "cleaving" it along the lines (represented by dashed lines in FIG. 3) perpendicular to the chiral vector, and then "rolling" it up in the direction of the chiral vector. In this way, there is formed a cylinder of diameter $d=|C|/\pi$.

The chiral vector C can be set in relation to two unit vectors, designated by $a_1$ and $a_2$, which define the lattice of the planes in the graphite, by means of two indices n and m, according to the following equation:

$$C = n \cdot a_1 + m \cdot a_2.$$

Linked to the above indices n and m are an angle $\phi$, referred to as chiral angle, and the diameter d of the nanotube, according to the following equations:

$$\phi = \arccos\left[\sqrt{3}\,(n+m)/2\sqrt{(n^2+m^2+nm)}\,\right]$$

$$d = \frac{a}{\pi}\sqrt{n^2+m^2+nm}$$

The values of the indices n and m define the chirality of the nanotube, which is the state of the nanotube and which is different according to the way in which the hexagons of the graphite are arranged to form the cylindrical structure. The chirality of a nanotube is, therefore, given by the pair of integer indices (n, m), and determines the structural characteristics and hence the conductive properties of a nanotube. In particular, as regards the structure, nanotubes that have the indices n and m equal, i.e., nanotubes (n, n) are referred to as "armchair" nanotubes, on account of the arrangement of the hexagons of graphite with respect to the axis of the nanotube itself. Nanotubes in which one of the two indices is zero (n, 0), are referred to as "zigzag" nanotubes, whereas nanotubes with different indices are referred to, in general, as chiral nanotubes. The chirality conditions the conductance of the nanotube, its density, the reticular structure, and other properties. The chiral indices may, in principle, be obtained experimentally by measuring the chiral angle $\phi$ and the diameter d of the nanotube with a transmission-electron microscope (TEM) or with a scanning-tunnelling microscope (STM).

In addition, according to their chirality, nanotubes may be semiconductor nanotubes or metallic nanotubes. In fact, nanotubes where the indices of chirality of which satisfy the following relation:

$$n-m = 3 \cdot l = 0, 1, 2,$$

are metallic and hence conductors. All the others present a non-zero bandgap and, consequently, behave as semiconductors. Armchair nanotubes are metallic.

The fundamental bandgap of a semiconductor carbon nanotube depends upon the diameter d of the nanotube, according to the following relation:

$$E_{gap}=2y_0 a_{cc}/d$$

where $y_0$ is the binding energy of the carbon atoms, and $a_{cc}$ is the distance between two neighbouring carbon atoms.

Consequently, by appropriately modifying the chirality of the nanotube and hence its diameter, it is possible to modulate its bandgap. The two different geometrical structures of the molecule (i.e., the initial one and the modified one) can thus represent two stable states.

Carbon nanotubes can be produced in macroscopic amounts using various techniques: laser ablation, arc discharge, or else chemical vapour deposition. For a more detailed treatment regarding this latter technique see, for example, H. M. Cheng et al., Appl. Phys. Lett. 72, 3282 (1998).

In particular, this latter technique is compatible with the methods used in the microelectronics industry and enables nanotubes to be grown on the substrate. Using the various techniques, it has been found that the nanotube that can be produced in the largest quantities is the (10, 10) nanotube.

As has been said, carbon nanotubes represent a solution for meeting the need to reduce the size of devices present in integrated circuits. In fact, by means of these versatile molecules the road has been opened to the construction of molecular transistors. In particular, the first field effect transistor (FET), in which the channel was a nanotube functioning at room temperature, was manufactured by the researchers of Dekker's group at the University of Delft in 1998. For a more detailed treatment of the subject, see, for example, S. J. Tans et al., Nature, 393, 49 (1998). The above team of researchers deposited two gold electrodes (which functioned as source and drain) on a substrate of silicon dioxide grown on silicon (gate) and connected these two electrodes to a cylindrical single wall structure (SWNT), which functioned as channel. They measured the current-voltage characteristic of this three terminal device and found that it respected the characteristic of a field effect transistor.

A further nanometric electronic device is described in the aforementioned article "Carbon Nanotube-Based Nonvolatile Random Access Memory for Molecular Computing" and is illustrated in FIGS. 4a and 4b. The nanometric electronic device basically consists of a substrate (for example, doped silicon), on which nanotubes are arranged, on two different levels, orthogonally with respect to one another and vertically separated by a distance of 1-2 nm, in such a way as to cross at a point corresponding to each memory element. Arranged between the conductive substrate and the first level of nanotubes is a dielectric (for example, silicon dioxide, $SiO_2$), with the purpose of insulating the first level of nanotubes from the substrate, which is biased with a reference voltage (ground). Furthermore, the nanotubes of the second level are arranged on top of spacers made of (organic or inorganic) dielectric material, so as to be insulated from the nanotubes of the first level. Instead, no dielectric is interposed at the points where the nanotubes of the second level and the nanotubes of the first level cross.

The nanotubes are then connected to the rest of the circuit, outside the grid, by means of contacts, made, for example, of gold, these contacts being used both during reading and during writing. In particular, writing of the single memory element is performed by imposing an electrostatic action between the substrate and the point of crossing of the two nanotubes, through the dielectric.

The voltage values imposed depend upon the thickness of the dielectric and upon the energy levels required for guaranteeing a change of state of the nanotube (ON/OFF), in such a way that such changes will be reversible. The OFF and ON states for the individual memory element are shown in FIGS. 5a and 5b, respectively. In particular, a voltage value of 4.5 V for the ON state and a value of 20 V for the OFF state have been estimated.

Consequently, reading of the individual memory element would be done electrically, always by means of the electrical contacts arranged on the edge of the grid, by measuring the resistivity associated to the two states ON/OFF.

The main limitations which, at the moment, prevent industrial development of the above approach are outlined in what follows.

A first limitation is represented by the fact that the techniques used for the manufacture of said architecture do not enable control of the nature of the nanotubes used. In particular, there will be a random distribution of metallic nanotubes (M) and semiconductor nanotubes (S). This implies that, in the read step, the values of resistivity measured on different cells that are in the same state, ON or OFF, undergo, even major, fluctuations according to the geometrical configuration (chirality) of the two nanotubes concerned. For instance, the crossings between nanotubes M-M, M-S, S-S are possible, to which different levels of resistivity are associated, corresponding both to the ON state and to the OFF state, even though the levels of resistivity for the two states ON-OFF remain, basically, distinguishable.

A second limitation, which may prevent operation of the nonvolatile memory architecture described herein, is represented by the possibility that, during reading operations, current paths are set up, which are able to falsify the interpretation of the state of an individual cell. This problem is known, and occurs, for example, in optical scanning systems of a matrix type. By way of example, FIG. 6 illustrates a schematic circuit diagram in which acquisition of the state is in effect falsified as a result of the multiple paths of the current. Generally speaking, this problem is solved using rectifying diodes connected in series to each sensing element so as to prevent the diodes from being traversed by reverse currents. In the case in point, this possibility would risk markedly influencing the complexity of the system, i.e., the final storage capacity, unless the rectification functions can be integrated by acting directly on the metal-semiconductor characteristics of the nanotubes. In this way, it would be possible to generate Schottky junctions, already integrated in the cell array.

A third limitation is represented by the fact that the configuration entails the manufacture, arrangement and manipulation of individual nanotubes, appropriately organized and insulated from the rest of the structure. This operation is very difficult, as well as being costly, in so far as the products of the processes of synthesis are, generally speaking, bundles of nanotubes, and the extraction of a single molecule from the bundle would involve additional process steps, together with the manipulation of the molecules.

SUMMARY

According to one aspect of the present invention, a molecular memory using carbon nanotubes and a manufacturing method thereof are provided which enable the drawbacks of the memory devices according to the known art to be overcome.

According to a further aspect of the present invention, a method and a sensor determine whether a DNA molecule contacting two nanoelectrodes has been hybridized.

BRIEF DESCRIPTION OF THE DRAWINGS

For a better understanding of the present invention, there is now described a preferred embodiment thereof, purely by way of non-limiting example, with reference to the attached drawings, in which:

FIGS. 4a and 4b illustrate the architecture of a nonvolatile memory using carbon nanotubes according to the prior art;

FIGS. 5a and 5b are a schematic representation of ON and OFF states of a memory element of the memory of FIGS. 4a and 4b;

DETAILED DESCRIPTION

Figure 1:
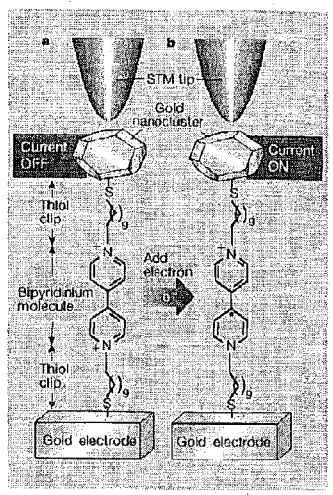
FIG. 1 illustrates the passage of a bipyridine molecule to the conductive state by reduction of a benzene ring, according to the known art.
Figure 2A:
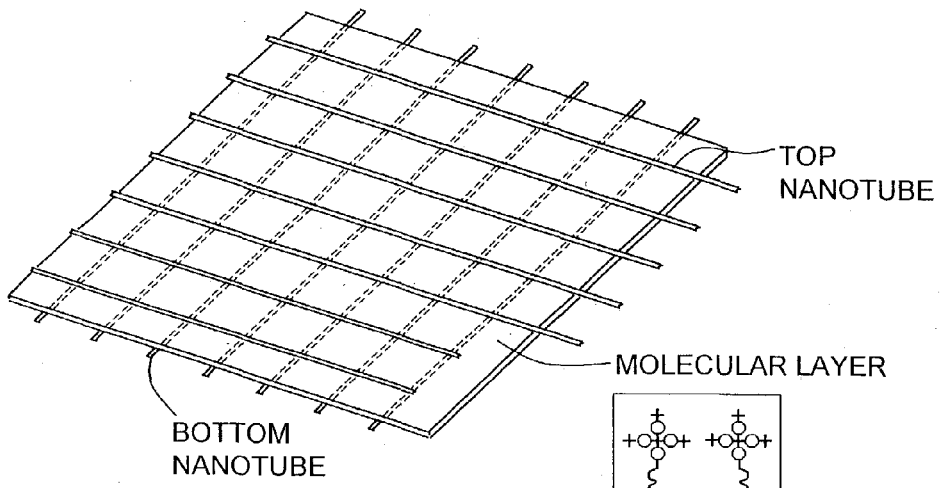
FIGS. 2a and 2b illustrate the architecture of a molecular memory which uses rotaxane molecules, according to the known art.
Figure 2B:
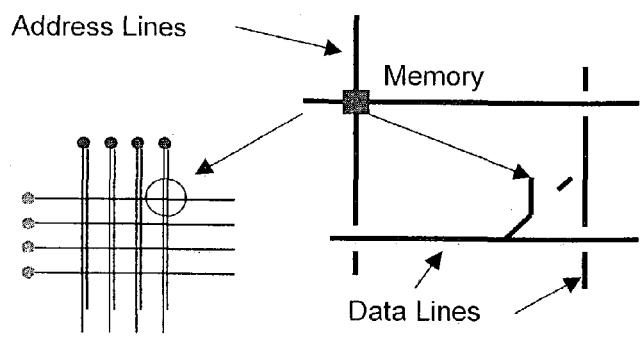
Figure 3:
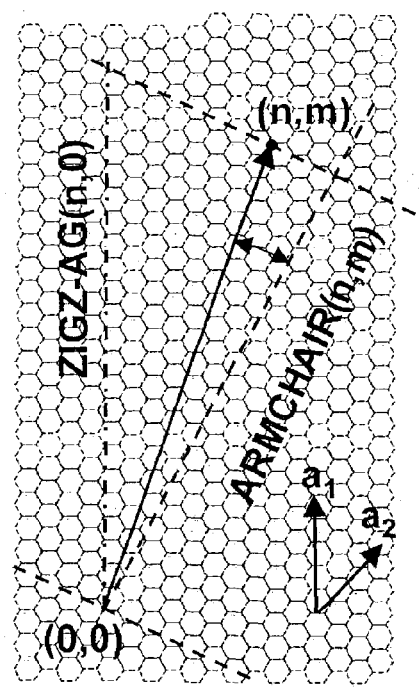
FIG. 3 illustrates the characterization of the geometry of a carbon nanotube using the chiral vector
Figure 6:
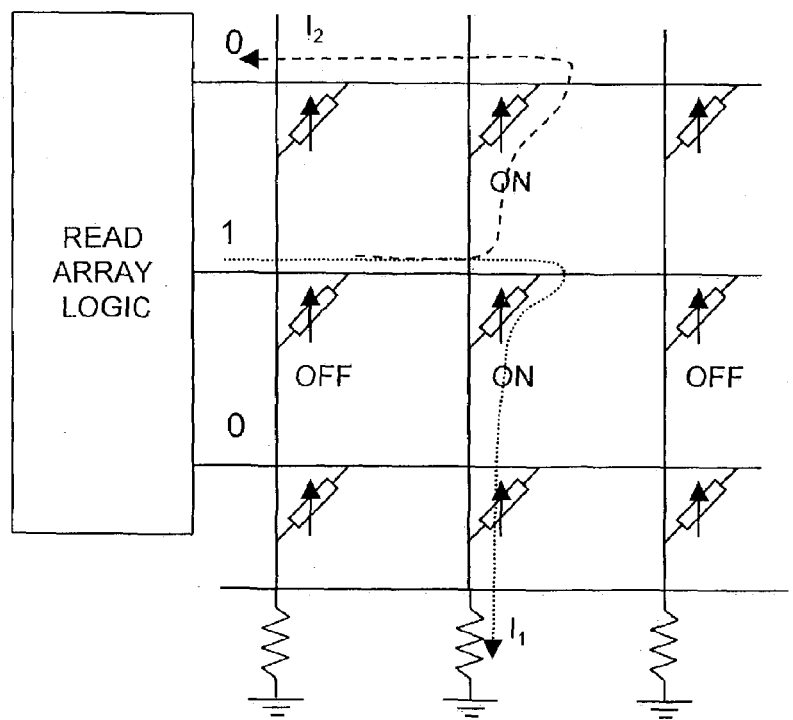
FIG. 6 is a schematic representation of how an incorrect reading, caused by the presence of multiple current paths, can occur in the nonvolatile memory of FIGS. 4a and 4b.

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

An idea underlying the embodiments of the present invention to be described is to provide a nonvolatile memory manufactured according to an architecture which envisages the use of carbon nanotubes as electrical connectors and DNA strands as physical means on which to write the information.

In other words, the nonvolatile memory according to an embodiment of the present invention is obtained using a set of DNA strand molecular switches, the addressing of which is controlled by means of molecular wires constituted by carbon nanotubes.

In particular, the memory is made up of an array of molecular memory cells, in which the individual devices are assembled together in a controllable and orderly manner, and it is possible to read their state electronically by means of a system of nanoelectrodes to which the individual molecular wires belong. This enables reproduction, at a molecular level, of the functions of a traditional memory, i.e., one based upon electronic semiconductor devices.

As is known, in fact, DNA, which is the molecule that contains genetic information, can be considered as a valid alternative to the creation of molecular circuits. In fact, in the last few years, it has emerged that it is possible to transport electrical charge through the double helix of DNA. In particular, on the basis of the studies conducted at Delft University in Holland, it has been experimentally verified, by measuring the transport of charge through a double strand of DNA of some ten nanometers in length, which contacts two nanoelectrodes, that DNA behaves as a good conductor of electricity. For a more detailed treatment of the subject, see, for example, Danny Porath, Alexey Bezryadin, Simon de Vries, and Cees Dekker, Nature, 403, 635 (2000).

DNA can also be considered, from this point of view, a molecular wire, given that its lateral dimensions are around 4 nm. Conduction is possible only if there is a double strand of DNA, i.e., if the DNA is hybridized. There exist various models that explain the phenomenon of conduction through the double helix. According to a first model (DNA as conductive wire), the double strand of DNA contains two polyanionic strands, the coupling of which affects the transfer of charge in the double helix by means of a process referred to as "super-exchange", in which an excited state is separated by bridges between the conjugated bases.

According to a second model (hole-hopping model), conjugation between the bases is not necessary, but a discrete distribution of the base pairs along the strand is sufficient. The transfer of charge takes place via channelling of the charge through the bases.

According to a third model (phonon-assisted polaron hopping), which is a hybrid of the two previous models, a polaron in the DNA, which extends for the length of 5-7 base pairs, can favour conduction along the strand, thanks to the internal movements which occur in the strand itself and which determine skipping of the polaron.

The described embodiments of the present invention create a nonvolatile memory that exploits the phenomenon of hybridization of DNA strands as a tool for writing bits of information.

More specifically, the individual strands of a DNA capture probe, functionalized using thiol groups, are attached to an array of nanoelectrodes, coated, for example, with gold. The surface of a carbon nanotube is in turn functionalized by means of appropriate terminations, such as, for example, carboxyl terminations. In this way, the DNA strands, which are already fixed at one end to the nanoelectrodes, orient themselves in the direction of the nanotube with the assistance of an electric field and bind to the nanotube. Prior to this second bond actually being made, a choice is made as to which strands are to be hybridized with the corresponding complementary single strand (DNA target probe).

Once the nanoelectrode-DNA-nanotube circuits have been closed, only the double strands will conduct electric current. Where there is a single strand, no electric current will, instead, be measured.

Figure 19:
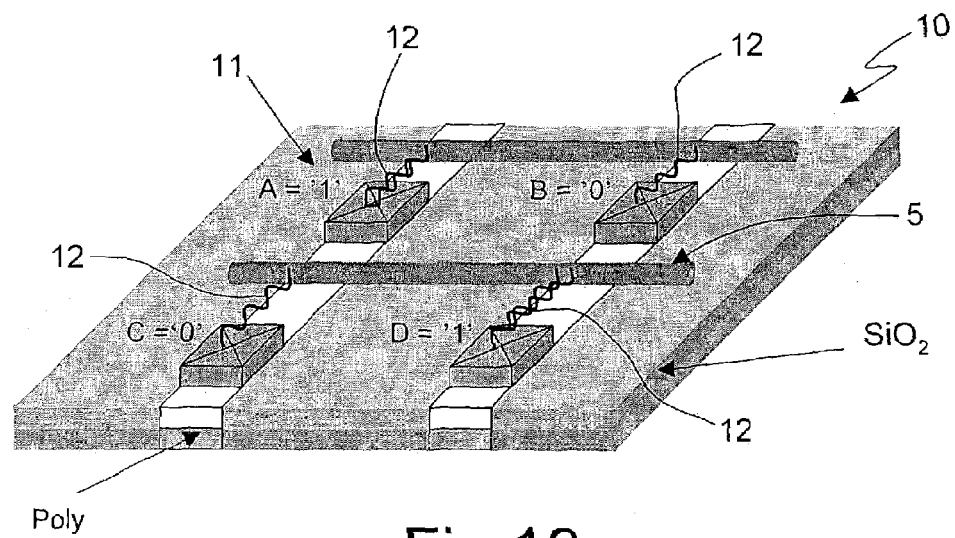
FIG. 19 is a schematic circuit diagram of a molecular memory according to one embodiment of the invention.

In this way, an array of memory cells will be created, as illustrated in FIG. 19, to each of which it will be possible to associate an 'ON' or 'OFF' logic state. As a whole, this system constitutes a nonvolatile memory, in which the information content can subsequently be thermally erased as a result of denaturation.

The capacity for storing information in this type of memory depends upon the number of bases that encode each individual strand of DNA, i.e., upon the length of the switch. In particular, if a DNA strand made up of 50 bases is bound to the carbon nanotube (for a total length of 16 nm), $4^{50}$ combinations of said bases will be possible, and hence $4^{50}$ possible types of DNA that can be hybridized in a selective manner. In general, if a probe is made up of N bases, the total number of capture probes that can be formed is given by the combinations, with repetition, of N objects taken 4 at a time, i.e., $4^N$. This number, in the case of capture probes of 50 bases each, is already enormous.

This represents a practically non-limited number of combinations, which guarantees the design of memories with high data densities already with strands that are so short. It is possible to provide an estimate of the density of data that can be recorded. In fact, if we consider that a nanotube may be some microns long (for example, 5 µm) and that the distance between two DNA helices in the nanotube is chosen in conformance with the lithographic means available at the moment of fabrication or with pick-and-place techniques such as, for example, Dip Pen Nanolithography, then, assuming, for example, that said distance may vary between some tens of nanometers (say, 30 nm) and 150 nm, in a 5-µm-long nanotube it will be possible to fit between 170 and 30 different DNA probes. If we consider, then, replicating this structure and setting two of said nanotubes at a distance of between 150 nm and 30 nm apart, in an area of 5 µm×5 µm it will be possible to fit approximately between 1000 and 28 000 probes, for an information density of between approximately 25 Gbit/in² and 650 Gbit/in².

The process for making the memory according to one embodiment of the invention will be summarized in what follows.

First of all, the array of nanotubes is made by positioning the nanotubes according to a precise scheme. The said nanotubes can be functionalized so as to have atomic terminations suitable for the formation of the amide bonds with the chosen capture probes. In particular, by means of a positioning system, a contact is made between the strands of the DNA probe and the nanoelectrodes. Next, selective hybridization of the DNA probes which have been chosen for writing the logic state "1" is carried out. In practice, the information is written by hybridization of the double helix in the array itself. Then, the DNA strands that have not been hybridized are completely removed by washing.

After this step, the contacts are made both of the hybridized DNA probes and the non-hybridized DNA probes by the application of an orienting electric field, so as to enable electrical contact. In order to detect whether hybridization has occurred, i.e., in order to verify the logic state of an individual memory cell, it will suffice to check that an electrical current is flowing in the DNA strands by means of the carbon nanotube interconnection system on the one hand, and by the polysilicon-nanoelectrode interconnection system on the other. One and the same circuit arrangement may be used both to apply the orienting electric field and to detect the current flow between the nanotube and the nanoelectrode. In particular, the orienting electric field may be applied by connecting a voltage generator and a resistor between the nanotube and the nanoelectrode, and the current flow between the nanotube and the nanoelectrode may be detected by measuring the voltage drop across the resistor.

A process for manufacturing the memory according to one embodiment of the invention will now be described in greater detail with reference to FIGS. 7-18.

Figure 7:
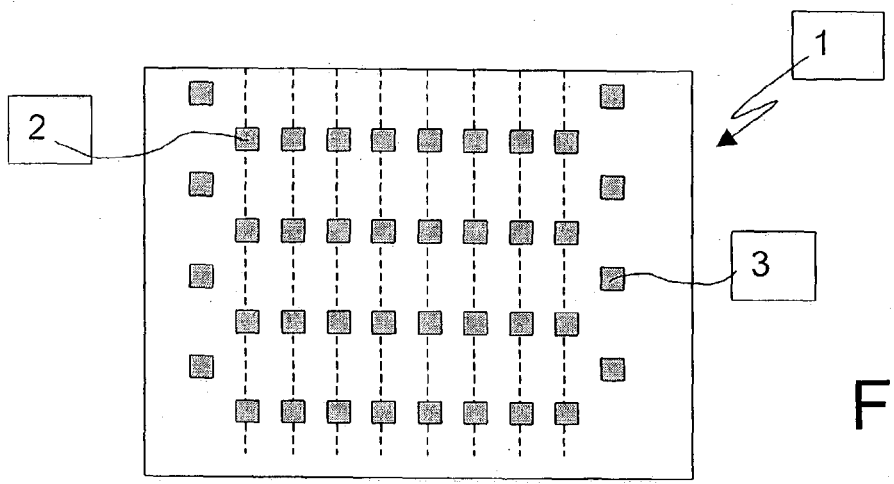
FIG. 7 illustrates a nanoelectrode array deposited on silicon dioxide, according to one embodiment of the invention.

In particular, an array of nanoelectrodes 2 and an equivalent set of nanoelectrodes 3, necessary to enable growth of the system of nanotubes and to make their contacts, are made on a substrate 1 of thermal silicon dioxide ($SiO_2$) (FIG. 7).

In particular, the nanoelectrodes 2 are for example made of polysilicon (palladium or titanium may also be used), have a size smaller than 100 nm (for example 30-50 nm), and are contacted on the rear (dotted lines).

A layer of silicon dioxide is then grown on the array of nanoelectrodes 2 in order to protect the polysilicon from any possible contamination due to the subsequent steps of chemical deposition.

Figure 8:
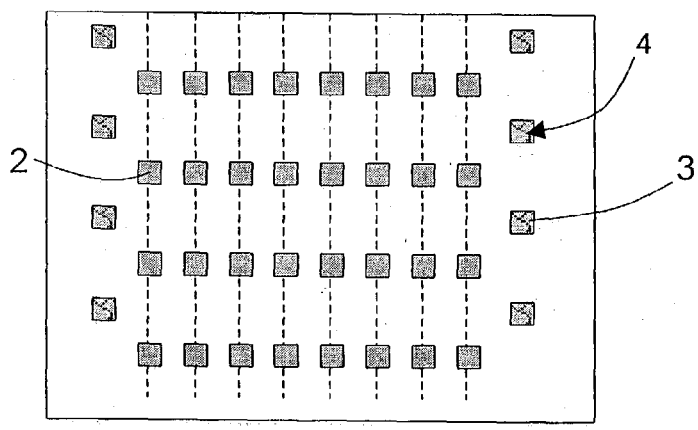
FIG. 8 illustrates the step of deposition of a catalyst on the electrodes, according to one embodiment of the invention.

At this point, a catalyst 4 is deposited using the soft lithography technique (for example, microcontact printing) or equivalent techniques, on the nanoelectrodes 3 between which the nanotubes are to be grown. The catalyst 4 is then calcined so as to form metallic nanoparticles, which will cause the growth of the nanotubes (FIG. 8).

Figure 9:
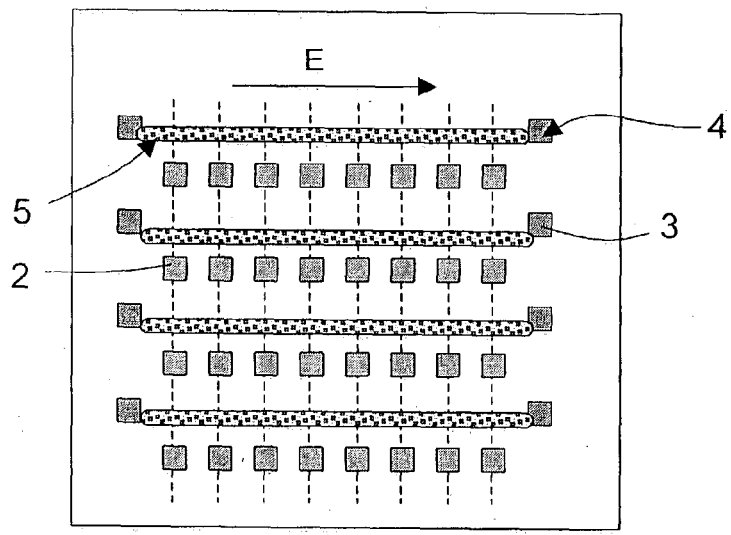
FIG. 9 shows the growth via chemical vapour deposition of an nanotube array, assisted by oriented electric fields, according to one embodiment of the invention.
Figure 10:
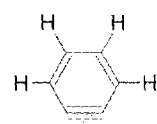
FIG. 10 shows a benzyne molecule.

This is followed by a step of chemical vapour deposition (CVD) assisted by an electric field E, so as to favor oriented growth of the carbon nanotubes 5 (FIG. 9).

A similar growth technique is, for example, reported in Y. Zhang, A. Chang, J. Cao, Q. Wang, W. Kim, Y. Li, N. Morris, E. Yenilmez, J. Kong and H. Dai, Appl. Phys. Lett. 79, 3155 (2001).

An alternative to the CVD method for growing nanotubes is the use of the nanomanipulation technique. According to this technique, the individual nanotubes are arranged in the desired positions using the tip of an atomic force microscope (AFM) as nanomanipulator. For a more detailed treatment of this technique, see for example T. Hertel, R. Martel, Ph. Avouris, J. Phys. Chem. B 106, 910 (1998).

The carbon nanotubes that are used are, in particular, conductive nanotubes or in any case nanotubes capable of transferring electrical charge, so as to enable the formation of a contact between the nanotube and a DNA strand. For example, carbon nanotubes of the (10, 10) armchair type, which are excellent conductors of a metallic type and may be obtained with high yields, can be used After formation of the nanotubes 5, the protective silicon dioxide present on the nanoelectrodes 2 is removed, and gold is deposited, for example using electron beam lithography or other known techniques.

Next, the nanotubes 5 are functionalized so as to have atomic terminations suitable for the formation of the amide bond with the capture probes chosen. In particular, functionalization of the nanotubes 5 is achieved by depositing, for example, a benzyne molecule $C_6H_4$ (shown in FIG. 10), or else a benzyne derivative, characterized by the presence of an alkyl chain, $C_6H_3$—R. The said deposition can be carried out locally, or else by causing the reactions to occur locally using an atomic force microscope, and using, for example, the Dip Pen Nanolithography (DPN) technique. For a more detailed treatment of the said technique, see for example R. D. Piner, J. Zhu, F. Xu, S. Hong, C. D. Mirkin, *Science*, 283, 661 (1999).

The benzyne will bind stably to the surface of the nanotube by cycloaddition [2+2]:

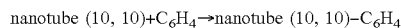

nanotube (10, 10)+$C_6H_4$→nanotube (10, 10)-$C_6H_4$ as, for example, is described in "Formation of Carbon Nanotube Based Gears: Quantum Chemistry and Molecular Mechanics Study of the Electrophilic Addition of o-Benzyne to Fullerenes, Graphenes, and Nanotubes (Jaffe, 1997).

Figures 11A, 11B:
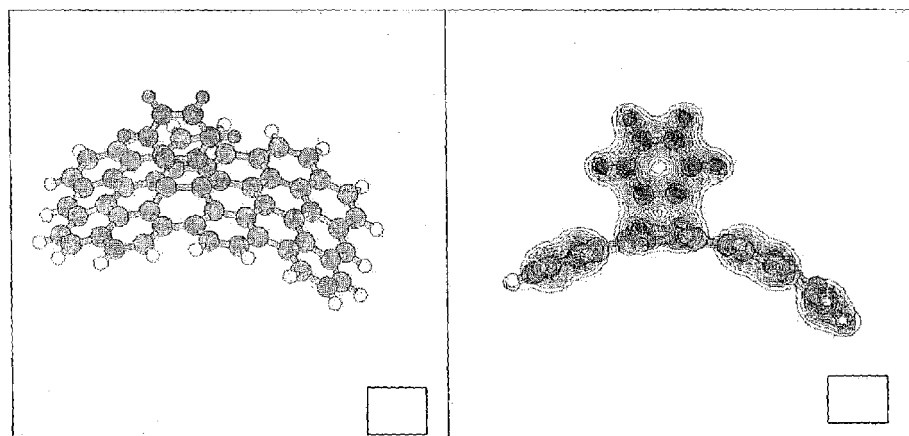
FIG. 11a illustrates the simulation of a sidewall cycloaddition [2+2] of a benzyne molecule to a (10, 10) nanotube.
FIG. 11b illustrates the distribution of the binding electrons established after a cycloaddition as a result of a first principles simulation.

FIGS. 11a and 11b are schematic illustrations of the way in which the nanotube is functionalized. In particular, FIG. 11a shows the simulation of a sidewall cycloaddition [2+2] of a benzyne molecule to a (10, 10) nanotube, whilst FIG. 11b shows the distribution of the binding electrons that is established after a cycloaddition, as a result of a first principles simulation.

Figure 12:
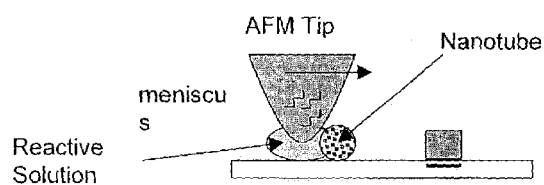
FIG. 12 illustrates a diagram, in cross-sectional view, of the tip of an atomic force microscope used for the Dip Pen Nanolithography (DPN) process, which locally brings about the cycloaddition reaction.

FIG. 12, instead, is a schematic illustration of the Dip Pen Nanolithography (DPN) technique, which causes the local occurrence of the cycloaddition reaction, and for which the tip of an atomic force microscope is used.

Functionalization of carbon nanotubes is, on the other hand, under study in other laboratories. In particular, at Rice University there has been obtained the functionalization of nanotubes by means of lateral methylation. In this connection, see for example E. T. Mickelson et al., J. Phys. Chem. B, 103, 4318 (1999). In addition, lateral functionalization approaches have also been considered, which make use, among other things, of aryl-diazonium salts. In this connection, see for example J. L. Bahr et al., J. Am. Chem. Soc. 123, 6536 (2001).

In any case, the principle underlying functionalization is that of setting the nanotube to react with molecules, which, by their very nature, tend to stabilize. Thus, for example, benzyne constitutes an excellent reagent, given that to re-establish its aromatic nature it tends to open the triple bond.

A further aspect of the present invention is represented by the possibility of functionalizing a nanotube locally with carboxyl groups, in particular using scanning probe microscopy (SPM) techniques (Dip Pen Nanolithography or else Scanning Tunnelling Microscopy—STM). With reference to the process of functionalization described above, if the first solution is chosen, i.e., deposition of the benzyne molecule, it will be necessary to proceed to a subsequent Friedel and Crafts alkylation (a known reaction for obtaining an alkyl termination). If, instead, the benzyne is deposited already alkylated, it is possible to pass on to the next step, namely oxidation of the alkyl chains with $KMnO_4$, $HNO_3$ or other oxidants, so as to obtain carboxyl groups —COOH.

Figure 13:
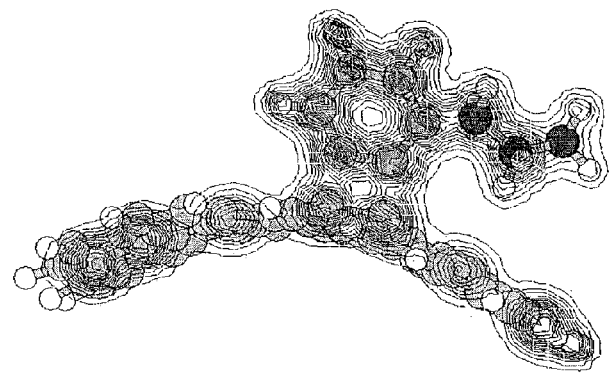
FIG. 13 illustrates the distribution of the electrons when the reaction of substitution of an alkyl radical occurs (Friedel and Crafts reaction) at the benzyne termination of the functionalized nanotube.

FIG. 13 shows, by way of example, the distribution of the electrons when the substitution reaction of an alkyl radical (Friedel and Crafts reaction) at the benzyne termination of the functionalized nanotube has taken place.

The next step is the protection of the carboxyl groups by means of esterification with alcohol R—OH (—COOH+R—OH→—COOR+$H_2O$).

Figure 14:
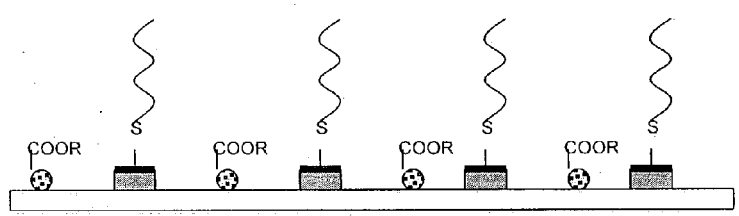
FIG. 14 illustrates the trace of the DNA capture probes on the polysilicon nanoelectrodes, according to one embodiment of the invention.

At this point, by means of a positioning system, a contact is made between the strands of the DNA probes and the nanoelectrodes 2. FIG. 14 shows the positioning of the DNA capture probes, which can be obtained, for example, by spotting. The ends of the probes have previously been functionalized by means of thiol groups. In this way, said probes bind stably to the gold (by self-assembly).

Alternatively, a regular film of DNA capture probes may also be obtained by dipping the substrate into a solution containing the DNA capture probes modified with thiol terminations. Thiol groups, in fact, self-assembly to the gold according to uniformly distributed packings. The substrate is subjected for a few minutes to an oxygen plasma. This, in fact, guarantees a high order of the self-assembled thiol layer.

Figure 15:
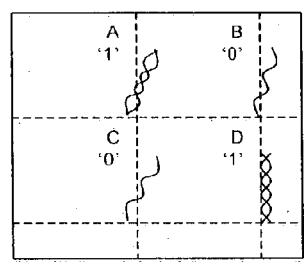
FIG. 15 illustrates the writing procedure via hybridization of the DNA capture probes in cells, according to one embodiment of the invention.

Next, selective hybridization of the probes chosen for writing the logic state "1" is carried out. In practice, the information is written by hybridization of the double helix in the array. FIG. 15 illustrates the process of writing of the information by means of the hybridization of the DNA capture probes with appropriately chosen complementary chains. This step consists, in practice, in the preparation of a suitable solution containing all the chains complementary to the capture probes corresponding to the memory units in which it is desired to write, for example, the logic state "1". The chains are hybridized at the units. For example, if the cells shown in FIG. 15 contain, respectively, the sequences (probes):

A) CAGTC . . . , B) TAAGC . . . , C) GGCCA . . . , D) AAATT . . .

for the logic state "1" to be activated for the cells A and D and the state "0" to be activated for B and C, there must be present in solution the two chains A' and D' complementary to A and D, respectively, namely:

A') GTCAG . . . , D') TTTAA . . . , whereas the sequences B' and C', complementary to B and C, will not be present, namely the sequences:

B') ATTCG . . . , C') CCGGT . . .

Next, the DNA strands that have not been hybridized are removed completely by washing. The substrate is then dried by means of an argon or nitrogen jet or by centrifugation.

The idea of using DNA thus enables unique association to any capture probe of its own complementary chain, given that the phenomenon of hybridization is selective for the complementary sequence. Furthermore, as mentioned previously, DNA enables a vast choice between the possible combinations in the bases of the capture probes. In fact, if a capture probe is made up of N bases, the total number of capture probes that can be formed will be given by the combinations, with repetition, of N objects taken 4 at a time, which are thus $4^N$. The said number, in the case of capture probes of 50 bases each, is already enormous.

Figure 16:
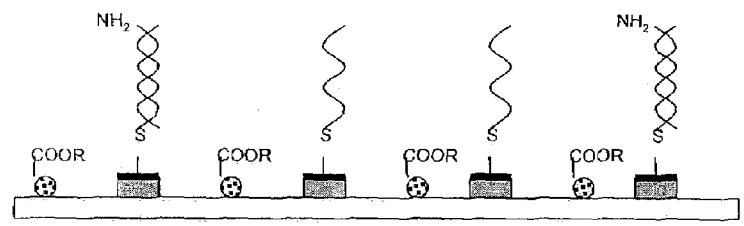
FIG. 16 illustrates hybridized and non-hybridized DNA capture probes in the various memory cells, according to one embodiment of the invention.

FIG. 16 illustrates hybridized and non-hybridized capture probes in the various memory cells.

After this step, contacts are made both for the hybridized probes and for the non-hybridized probes by application of an orienting electric field, so as to make possible the electrical contact. With the purpose of detecting that hybridization has actually taken place, i.e., verifying the logic state of a single memory cell, it will be sufficient to verify the passage of current in the DNA strands by means of the carbon-nanotube interconnection system, on the one hand, and by means of the polysilicon-nanoelectrode interconnection system, on the other.

Figure 17:
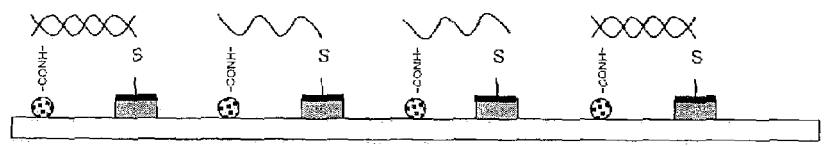
FIG. 17 illustrates the formation of the —CONH— amide bonds between a functionalized nanotube and a hybridized and non-hybridized DNA capture probes, obtained by applying an electric field between the nanotube and the nanoelectrode, according to one embodiment of the invention.

FIG. 17 illustrates the step in which the —COOH groups are again liberated (for example, by means of acidic hydrolysis), and by applying an electric field between the array of polysilicon electrodes and the nanotubes, the formation of the —CONH— amide bond will be made possible, according to the following acidic-hydrolysis reaction:

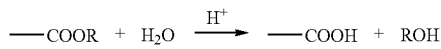

Owing to the conductive properties of the DNA, there will be passage of current between the nanoelectrode and the nanotube of the hybridized DNA, and this enables reading of the logic state "1" or logic state "0". The erasure of the information content of the memory can come about thermally as a result of denaturation of the DNA.

Figure 18:
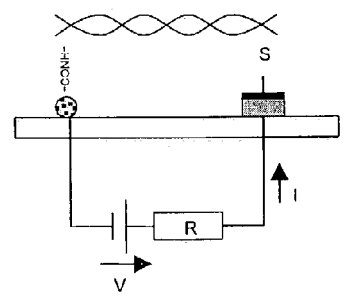
FIG. 18 is a schematic circuit diagram of a device for applying an electric field between a nanotube and a nanoelectrode.

The electric field between the nanoelectrode and the nanotube may be applied as shown in FIG. 18, i.e., by simply connecting a voltage generator and a resistor between the nanotube and the nanoelectrode. Such a circuit arrangement may also be used as a so-called DNA sensor to detect whether or not the DNA molecule contacting the nanotube and the nanoelectrode has been hybridized. In fact, if the DNA molecule has been hybridized, then an electric current will flow between the nanotube and the nanoelectrode, whereas if the DNA molecule has not been hybridized, then no electric current will flow therebetween. Therefore, to detect whether or not the DNA molecule contacting the nanotube and the nanoelectrode has been hybridized it suffices to measure the current flowing in the circuit shown in FIG. 18 and this may be carried out simply by measuring the voltage drop across the resistor.

By way of example, FIG. 19 shows a memory device, designated as a whole by 10, comprising a molecular memory designated as a whole by 11, made up of a plurality of memory cells, each made in the way described above. In particular, in the example illustrated in FIG. 19, four memory cells are shown, designated by A, B, C, and D, for each of which the logic state is indicated, obtained by proceeding or otherwise to the hybridization of the DNA strands, designated in the figure by 12, according to the bit that is to be stored.

A memory according to the described embodiments of the present invention affords considerable advantages over traditional memories. Principally, the joint use of carbon nanotubes and DNA, makes it possible to have molecules on a large scale in a controllable and orderly way.

A further advantage lies in the possibility of reducing the dispersion of heat and in the consequent low power consumption.

A further advantage lies in the possibility of carrying out electronic reading of the molecular cells using current technology.

Finally, the embodiments illustrate a molecular device with a high density of memory elements, of the order of various tens of Gbit/in$^2$, and with writing times, which are dictated just by hybridization, of approximately 1 hour.

The embodiments of the present invention shown in FIGS. 7-19 may be implemented an integrated circuit (IC) that is part of an electronic system. For example, the described memory may be part of a memory IC that is coupled to a processor to form a computer system or portion thereof.

The invention claimed is:

1. A method for manufacturing a molecular memory device, comprising:
    forming an array of first nanoelectrodes on a substrate of insulating material;
    forming on said substrate a plurality of carbon nanotubes;
    functionalizing said nanotubes so that they are suitable for making contacts with DNA strands;
    contacting said first nanoelectrodes to first ends of the DNA strands;
    contacting said nanotubes to second ends of the DNA strands;
    hybridizing or not hybridizing said DNA strands to store desired data in the DNA strands.

2. The method according to claim 1, wherein forming a plurality of carbon nanotubes comprises:
    forming on said substrate an array of second nanoelectrodes;
    depositing a catalyst on the second nanoelectrodes, among which said nanotubes are to be grown;
    subjecting said catalyst to calcining so as to form metallic nanoparticles acting as seed for the growth of said nanotubes; and
    growing said nanotubes.

3. The method according to claim 2, wherein growing said nanotubes comprises performing chemical vapor deposition (CVD) assisted by an electric field (E) such as to favor the oriented growth of the nanotubes.

4. The method according to claim 1, wherein forming a plurality of nanotubes comprises forming the plurality of nanotubes with an atomic force microscope (AFM).

5. The method according to claim 1, wherein the functionalization of said nanotubes is performed using carboxyl groups.

6. The method according to claim 1, wherein functionalizing said nanotubes comprises depositing on the nanotubes a benzyne molecule $C_6H_4$ or a benzyne containing an alkyl chain $C_6H_3$-R.

7. The method according to claim 6, wherein the method further comprises effecting a Friedel and Crafts alkylation.

8. The method according to claim 6, wherein the method further comprises oxidizing the alkyl chains to obtain carboxyl groups —COOH.

9. The method according to claim 8, wherein the method further comprises protecting said carboxyl groups by esterification with an alcohol R—OH.

10. The method according to claim 1, wherein the method further comprises functionalizing said DNA strands using thiol groups.

11. The method according to claim 1, wherein hybridizing said DNA strands writes the logic state "1".

12. The method according to claim 1, wherein not hybridizing said DNA strands writes the logic state "0".

13. The method according to claim 1, wherein the method further comprises removing said non-hybridized DNA strands by washing.

14. The method according to claim 1, wherein contacting said nanotubes to second ends of the DNA strands comprises applying an orienting electric field between said nanoelectrodes and said nanotubes to form amide bonds —CONH—.

15. A molecular memory device manufactured according to the method of claim 1.

16. A computer system, comprising;
    a molecular memory device manufactured according to the method of claim 5.

UNITED STATES PATENT AND TRADEMARK OFFICE
CERTIFICATE OF CORRECTION

PATENT NO.       : 7,272,511 B2
APPLICATION NO.  : 10/601327
DATED            : September 18, 2007
INVENTOR(S)      : Luigi Occhipinti et al.

It is certified that error appears in the above-identified patent and that said Letters Patent is hereby corrected as shown below:

On the title page item [75] Giuseppe Panzera, San Pietro Clarenza not San Pietro Ci Arenza.

Signed and Sealed this

Sixth Day of January, 2009

JON W. DUDAS
*Director of the United States Patent and Trademark Office*